(12) United States Patent
Atallah et al.

(10) Patent No.: US 6,441,600 B1
(45) Date of Patent: Aug. 27, 2002

(54) APPARATUS FOR MEASURING THE DUTY CYCLE OF A HIGH SPEED CLOCKING SIGNAL

(75) Inventors: Francois Ibrahim Atallah; Anthony Correale, Jr., both of Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/766,200

(22) Filed: Jan. 19, 2001

(51) Int. Cl.[7] ............................. G01R 19/00; H03K 7/08
(52) U.S. Cl. ..................... 324/76.11; 327/175
(58) Field of Search ................. 324/76.11; 327/175, 327/31, 33; 341/157

(56) References Cited

U.S. PATENT DOCUMENTS

| | | |
|---|---|---|
| 4,041,386 A | 8/1977 | Thomas et al. |
| 4,164,733 A | 8/1979 | Landsburg et al. |
| 4,475,086 A | 10/1984 | Allen |
| 5,130,565 A * | 7/1992 | Girmay ................. 327/175 |
| 5,367,200 A | 11/1994 | Leonida |
| 6,040,726 A | 3/2000 | Martin |
| 6,316,926 B1 * | 11/2001 | Savo et al. ............... 323/282 |

* cited by examiner

*Primary Examiner*—N. Le
*Assistant Examiner*—James Kerveros
(74) *Attorney, Agent, or Firm*—Scully, Scott, Murphy & Presser, P.C.; Scott W. Reid

(57) ABSTRACT

A system and method for accurately measuring the duty cycle of an input periodic pulsed signal. The system includes a device for converting the input signal to be measured into a first dc voltage and, a device maintaining representations of potential duty cycle values that are selectable in an iterative fashion. At each iteration, in response to a selected duty cycle value, a second dc voltage is generated that represents the difference between the duty cycle of the input signal to be measured and the duty cycle represented by a current selected encoded duty cycle value. A selection mechanism responds to the first and second dc voltages for selecting a different encoded duty cycle for a successive iteration. The system selects an encoded duty cycle value at each iteration until the first and second dc voltages match. At such time, the current selected encoded duty cycle value represents the duty cycle of the input voltage for output thereof. By representing the input signal's duty cycle as a dc voltage, the system may measure the input signal's duty cycle accurately regardless of its frequency.

17 Claims, 2 Drawing Sheets

| DAC Voltage | Digital Code | Duty Cycle |
|---|---|---|
| 0.756 | 0000 | 42/58 |
| 0.774 | 0001 | 43/57 |
| 0.792 | 0010 | 44/56 |
| 0.81 | 0011 | 45/55 |
| 0.828 | 0100 | 46/54 |
| 0.846 | 0101 | 47/53 |
| 0.864 | 0110 | 48/52 |
| 0.882 | 0111 | 49/51 |
| 0.9 | 1000 | 50/50 |
| 0.918 | 1001 | 51/49 |
| 0.936 | 1010 | 52/48 |
| 0.954 | 1011 | 53/47 |
| 0.972 | 1100 | 54/46 |
| 0.99 | 1101 | 55/45 |
| 1.008 | 1110 | 56/44 |
| 1.026 | 1111 | 57/43 |

APPARATUS FOR MEASURING THE DUTY CYCLE OF A HIGH SPEED CLOCKING SIGNAL

FIELD OF THE INVENTION

The present invention relates generally to digital circuits and, particularly, to a system and method for measuring the duty cycle of a high speed clocking signal.

BACKGROUND OF THE INVENTION

In the specification of system clock signals provided for integrated circuits (ICs), the signal "jitter" is the most important specification. The second most important specification of a system clock in ICs is its duty cycle. The high frequency of the clock signals implemented in high-speed circuits prohibits measurement at the pins of the integrated circuit (IC). To overcome this, techniques for measuring frequency and jitter have implemented a divided clock. Unfortunately, the duty cycle information gets lost once the clock signal is divided down.

Particular prior art system s for measuring the duty cycle of a periodic signal have been described in U.S. Pat. No. 4,475,086, issued Mar. 31, 1982, and U.S. Pat. No. 5,367,200, issued Nov. 29, 1993. These systems rely on counter devices for measuring and, in the case of U.S. Pat. No. 4,475,086, implementing a higher frequency clock. An alternative technique is to measure the duty cycle at the wafer level which is very expensive and can only be done at the development cycle and not at the production level.

It would be highly desirable to provide a circuit that enables the measure of the duty cycle of a clock independent of its frequency.

It would be further highly desirable an integrated circuit provided with a clock measurement circuit that is designed for measuring and ensuring that that the duty signal of a clock signal meets its specification.

SUMMARY OF THE INVENTION

It is an object of the invention to provide a clock measurement circuit that provides a reliable and accurate means of measuring and ensuring that the clock duty cycle meets its specification.

It is a further object of the invention to provide a clock measurement circuit that provides a reliable and accurate means of measuring and ensuring that the clock duty cycle meets its specification independent of its frequency.

It is another object of the invention to provide a clock measurement circuit that measures the clock duty cycle independent of its frequency, and which may be implemented in an IC to enable testing at the production level.

According to the principles of the invention, there is provided a system and method for accurately measuring the duty cycle of an input periodic pulsed signal. The system comprises a device for converting the input signal to be measured into a first dc voltage; a device for encoding a plurality of duty cycle values for selection thereof in an iterative manner, one value of which represents a duty cycle of the input signal; a device for iteratively generating a second dc voltage according to a difference between the duty cycle of the input signal to be measured and the duty cycle represented by a current selected encoded duty cycle value; and a selection mechanism responsive to the first and second dc voltages for selecting an encoded duty cycle value for each iteration. The system selects an encoded duty cycle value in each successive iteration until the first and second dc voltages match. At such time, the current selected encoded duty cycle value represents the duty cycle of the input voltage for output thereof.

Advantageously, by representing the input signal's duty cycle as a dc voltage, the system may measure the input signal's duty cycle accurately regardless of its frequency as any error associated with its frequency is eliminated. Furthermore, the system may be incorporated in a phase lock loop (PLL) or a delay lock loop (DLL) within an IC itself, adding only a minor increase in silicon real estate.

BRIEF DESCRIPTION OF THE DRAWINGS

Further features, aspects and advantages of the apparatus and methods of the present invention will become better understood with regard to the following description, appended claims, and the accompanying drawings in which:

DETAILED DESCRIPTION OF THE DRAWINGS

Figures 1, 2:
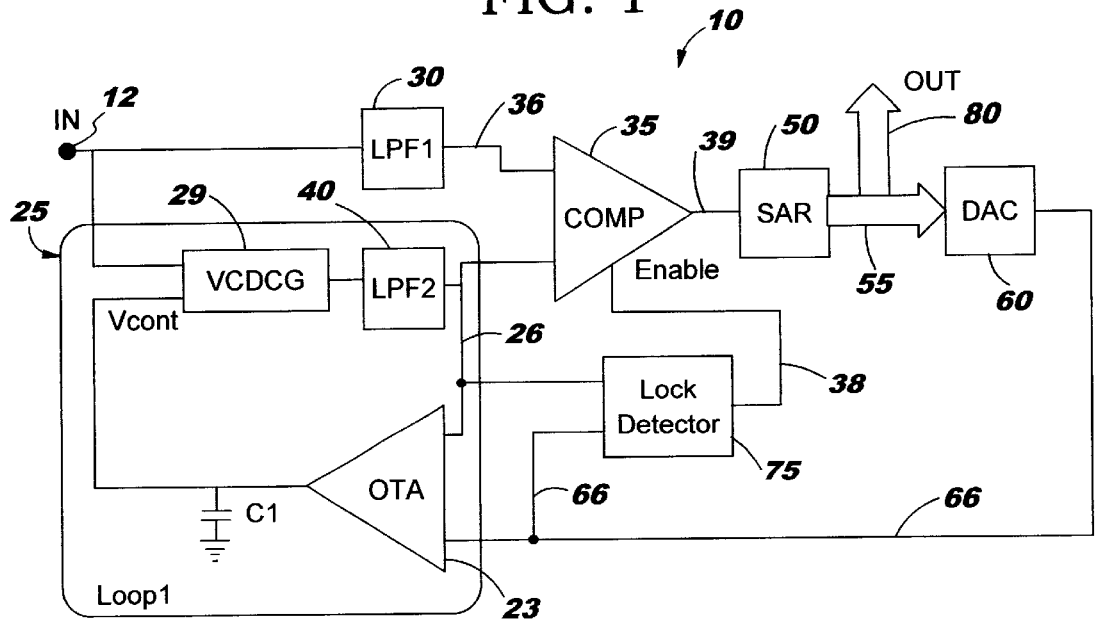
FIG. 1 illustrates a schematic diagram of the duty cycle measuring circuit 10 according to the invention.
FIG. 2 illustrates an example encoding table 100 representing the SAR bit assignments corresponding to the signals of various duty cycles and corresponding DAC output voltages.

This present invention utilizes the successive approximation technique for determining the duty cycle of a high speed clock signal, which is in the form of an encoded digital representation. FIG. 1 illustrates the duty cycle measuring circuit 10 of the invention which includes a precise and programmable duty cycle adjuster 25, a Low Pass Filter (LPF1) device 30 which converts the incoming signal's duty cycle into a DC analog voltage; a tri-statable analog comparator device (COMP) 35 which is used to compare the analog voltage output from LPF1 with an analog voltage output of a second low pass filter LPF2 40 when the comparator device 35 is enabled or not tri-stated; and, an n-bit Successive Approximation Register SAR 50 which stores the encoded value of the signal's output duty cycle. The output of the Successive Approximation Register or SAR 50 provides the digital representation 55 of the duty cycle of the signal under test, which is additionally input to a Digital to Analog Converter (DAC) device 60 which converts the digital contents of the SAR into an analog voltage. The number of bits out of the SAR matches the number of bits representing the accuracy of the DAC. Hence, for improved accuracy, the number of bits of the SAR and DAC may be increased as the technology warrants. A Lock Detector circuit 75 is also provided which acquires a lock generated in duty cycle adjuster 25 and generates an enable signal 38 for activating (or tri-stating) the comparator 35.

The programmable duty cycle adjuster circuit 25 utilizes a novel Voltage Controlled Duty Cycle Generator (VCDCG) 29 the operation of which is described in commonly-owned, co-pending U.S. patent application Ser. No. 10/020,528 entitled "A Precise and Programmable Duty Cycle Adjuster". As described therein, the Precise and Programmable Duty Cycle Adjuster 25 includes an Operational Transconductance Amplifier (OTA) 23 used to compare the analog voltage 26 output from LPF2 representing the desired duty cycle with an analog feedback voltage 66 output from the DAC 60. The OTA 23 particularly generates a current that is proportional to the difference of its input voltages. If the two voltages are equal, then no current will charge or discharge the capacitor C1 leading to a DC voltage at VCONT that forces the waveform output of the VCDCG 29 to be equal to the duty cycle of the signal output 80 as programmed by the SAR. On the other hand, if the duty cycle of the signal 26 at the output of the LPF2 40 is less than the desired duty cycle, then the output of the LPF2 40 will be smaller than the output of the DAC 60. The OTA will generate a current proportional to the difference between the output of the DAC and the output of the Low Pass Filter 40. The current will charge the capacitor causing VCONT to rise and the duty cycle at the output of the VCDCG 29 to increase. The mechanism is the same but in the other direction if the duty cycle of the VCDCG 29 is greater than the output 80 of the SAR. It should be understood that the Voltage Controlled Duty Cycle Generator (VCDCG) is inverting the input signal whose duty cycle is to be measured. If a non-inverting signal is desired, the output of the DAC 60 and the output of the LPF2 40 may be swapped going into the OTA 23. With more particularity, the Voltage Controlled Duty Cycle Generator 29 receives an input clock signal 12 under test and the output of the OTA. The output of the VCDCG 29 is the duty cycle corrected clock generated by a signal of a desired duty cycle in accordance with the output of the OTA (Vcont voltage).

FIG. 2 illustrates an example encoding table 100 representing the SAR bit assignments 110 corresponding to the signals of various duty cycles 120 and corresponding DAC output voltages. In the example system described herein, 4-bits of accuracy is assumed as is a voltage supply of 1.8 Volts DC assumed. The operation of the duty cycle measuring circuit of the invention is commenced by setting the output of the SAR register 50 to a digital code 102 representing an initial 50/50 duty cycle 104. This SAR setting and corresponding DAC output voltage 66 will initially reset the Lock Detector circuit 75 to "zero" for disabling the COMP 35. This setting constitutes the start of the first cycle of the Successive Approximation Technique of the invention. Typically, this technique requires at least the same number of cycles as the accuracy of its DAC. For example, a four-bit DAC 60 will enable the technique to reach a solution in four (4) cycles. Following the example in Table 1, the starting digital code would be "1000" which causes the DAC 60 to output a voltage equal to half of the power supply. Thus, from the table of FIG. 2, for the initial SAR setting 102 of 50/50 duty cycle and given a power supply voltage of 1.8V, the voltage representing the 50/50 duty cycle is (1.8)/2 or 0.9V.

As mentioned in view of FIG. 1, the output 66 of the DAC 60 is connected to one of the inputs of the Operational Transconductance Amplifier or OTA 23 provided in the programmable duty cycle adjuster circuit 25. The OTA 23 additionally receives as input the output 26 of a Low Pass Filter 2 or LPF2 40 whose voltage is a representation of the duty cycle out of the Voltage Controlled Duty Cycle Generator or VCDCG 29. The OTA 23 outputs a current proportional to the difference in voltage of its two inputs. If the voltage at the output 66 of the DAC 60 is higher than the voltage 26 output of the LPF2 40, the OTA 23 will charge the capacitor C1, thus raising the voltage at the output of the OTA 23 and at the $V_{cont}$ input pin of the VCDCG 29. This, in turn, will force the duty cycle at the output of the VCDCG 29 and the output of the LPF2 40 to move closer to the duty cycle depicted by the DAC 60. Eventually, after the lock time of Loop 1, the output 26 of the LPF2 40 will match the output of the DAC 60 and cause the Lock Detector to go to a "one" which enables the COMP 35. The two inputs of the COMP are the output 26 of LPF2 40 and the output 36 of LPF1 30 which represents the duty cycle of the input signal 12 whose duty cycle is being measured.

Figure 3:
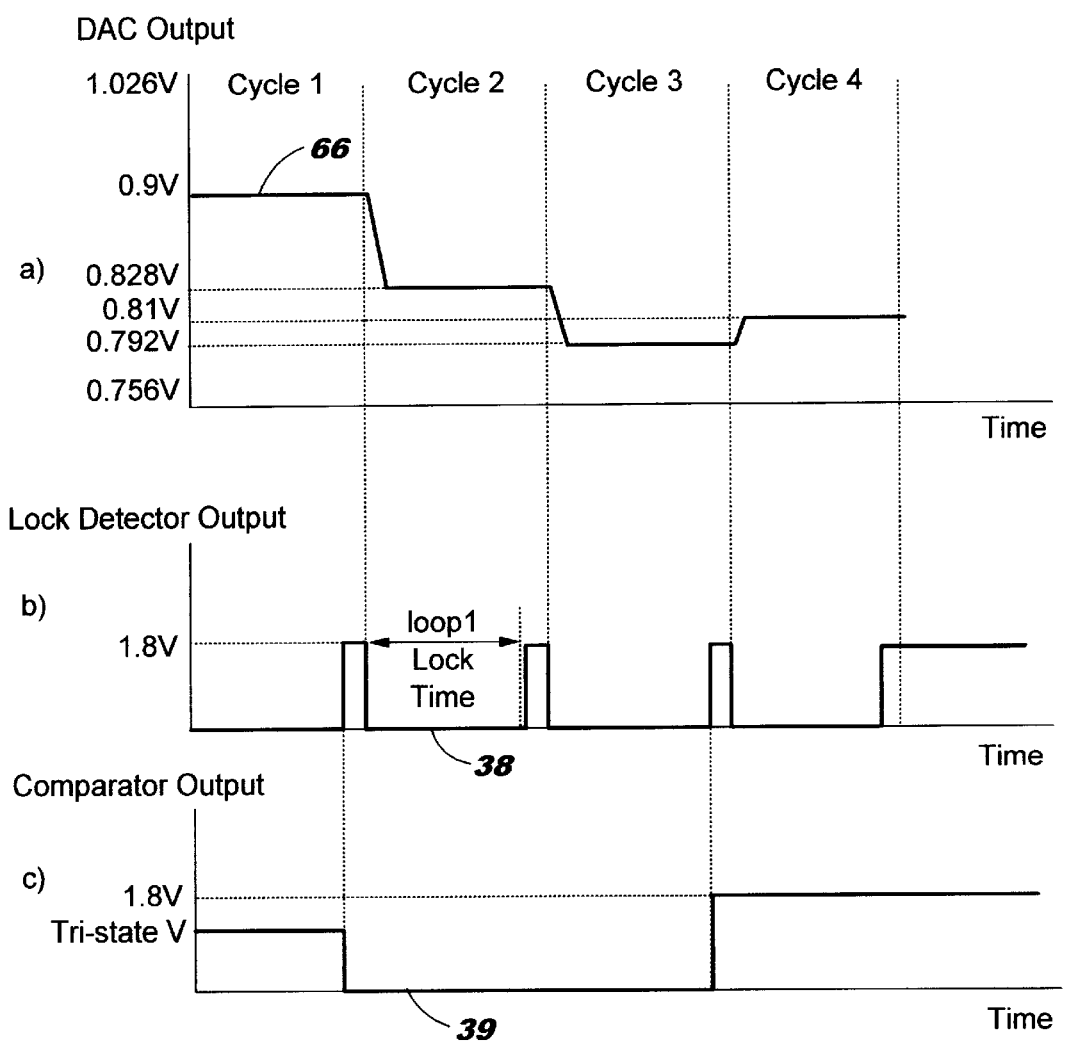
FIGS. 3($a$)–3($c$) represent various timing features of the duty cycle measuring circuit 10 according to an example implementation.

FIGS. 3(a)–3(c) represent various timing features of the duty cycle measuring circuit 10 according to an example implementation having an example signal under test with a duty cycle of 45/55. In the example implementation of FIG. 3(a), in a first cycle of operation, the output 66 of the DAC is 0.9 volts corresponding to an initial SAR register setting of "1000" as mentioned above. According to the example and, in further view of the table 100 of FIG. 2. the example signal under test having with a duty cycle of 45/55 will generate an output voltage 36 at the LPF1 30 of 0.45×1.8V or 0.81V. Since the output of LPF1 is lower than the output of LPF2, then 50/50 is larger than the duty cycle of the signal under test. In response, the COMP 35 will output a "zero" 39 forcing the most significant bit of the SAR 50 to change and latch a "zero". At the same time, the second most significant bit gets set to a "one" or "0100". In view of table 100 of FIG. 2, the output of the DAC 60 will now be at a value of 0.828V half way between 0.9V and the minimum voltage value of the DAC. The change in input to the DAC 60 causes a change at the input of the OTA and the input 66 to the Lock Detector, causing the Lock Detector to output a "zero" disabling the COMP. FIG. 3(b) illustrates the setting of the lock signal 38 to a zero which marks the beginning of Cycle 2 of the Successive Approximation technique.

As described earlier, after the lock time of Loop 1, the output of LPF2 will match the output 66 of the DAC thus, forcing the Lock Detector to go to a "one" enabling the COMP 35 and evaluating its input. Since the output voltage 36 of LPF1 is still lower than the output 26 of LPF2, the COMP will go to "zero" changing and latching the second most significant bit to "zero". At the same time, the third most significant bit will go to "1" resulting in an SAR digital code word of "0010". The DAC 60, for the third time will change its output value to ¼ of the value between 0.9V and the minimum value of the DAC, or 0.792V. The Lock Detector output 38 will go to "zero" in the third cycle thus disabling the COMP 35. Again, after the lock time of Loop 1, the output of LPF2 40 will reach the same voltage as the output of the DAC forcing the Lock Detector to go to "one" and thus enabling the COMP. Now the output of LPF2 is lower than LPF1, the COMP will output a "one" thus keeping and latching the "one" as the third most significant bit. At the same time, the least significant bit (LSB) shifts to "one" resulting in an SAR code of "0011" which corresponds to a DAC output of 0.81V. This new value results in the output 26 of LPF2 40 to be equal to the output 36 LPF1 in the fourth cycle, and the LSB will stay at a "one" indicating that the duty cycle of the signal under test is 45/55. The resulting digital output code of "0011" may then be read out by any digital testing device, either in parallel or, shifted out serially at a single IC output pin/wire.

The result will have an accuracy of +/−½lsb, and therefore, the accuracy of the DAC and the range of measured duty cycle determine the accuracy of the result. In the example described, each digital code represents 1% of duty cycle. With only 4-bits, the maximum duty cycles that can be measured will be limited to 57/43 and 42/58, respectively. The design of the VCDCG 29 has certain operational frequency limits to provide the desired noise immunity and hence, it is important to know the relative frequency range. The slope of the curve of duty cycle versus VCONT is affected by the number of stages of the VCDCG 29 which is, in turn, a function of the expected frequency range. A commonly-owned disclosure entitled "Enhanced Operational Frequency for a precise and programmable Duty Cycle Generator" and subject of co-pending U.S. patent application Ser. No. 10/017,071, describes a means to address these frequency limitations.

While the invention has been particularly shown and described with respect to illustrative and performed embodiments thereof, it will be understood by those skilled in the art that the foregoing and other changes in form and details may be made therein without departing from the spirit and scope of the invention which should be limited only by the scope of the appended claims.

What is claimed is:

1. A system for accurately measuring the duty cycle of an input periodic pulsed signal comprising:
   device for converting said input signal to be measured into a first dc voltage;
   device for encoding a plurality of duty cycle values for selection thereof in an iterative manner, one value of which represents a duty cycle of said input signal;
   device for generating a second dc voltage according to a difference between the duty cycle of said input signal to be measured and the duty cycle represented by a selected encoded duty cycle value at a current iteration; and,
   a selection mechanism responsive to said first and second dc voltages for selecting an encoded duty cycle value for a successive iteration, said system selecting an encoded duty cycle value for each successive iteration until said first and second dc voltages are matching, wherein said selected encoded duty cycle value at that current iteration represents the duty cycle of said input voltage for output thereof.

2. The system according to claim 1, further comprising a device for generating a reference dc voltage having a value according to a selected duty cycle value in each iteration, said device for iteratively generating a second dc voltage comprising:
   voltage controlled duty cycle generator system for receiving said input signal to be measured and converting said input signal into a periodic signal having a duty cycle in accordance with said reference dc voltage value for each iteration; and,
   device for converting said generated periodic signal into said second dc voltage for each iteration.

3. The system according to claim 2, wherein said selection mechanism comprises a device for comparing said first dc voltage and second dc voltage at each iteration and generating an output voltage in accordance with said difference, said output voltage for selecting a further encoded duty cycle value for a next successive iteration.

4. The system according to claim 3, wherein said voltage controlled duty cycle generator system is a closed loop system, operating for a lock time period defined as a time interval for said generated second dc voltage to match said current reference dc voltage in each iteration.

5. The system according to claim 3, wherein said further comprising a locking device for preventing said comparing of said first dc and second dc voltages during said lock time period, and enabling said comparing at each iteration when said generated second dc voltage matches said current reference dc voltage.

6. The system according to claim 4, wherein said encoding device comprises an n-bit successive approximation register for digitally encoding said duty cycle values.

7. The system according to claim 6, wherein said output comprises a digitally encoded word capable of being read out one in parallel or shifted out serially to a common output pin.

8. The system according to claim 6, wherein said device for generating a reference dc voltage includes an n-bit digital to analog converter (DAC) device, said system capable of generating an output signal in a number of iterations as determined by an accuracy of said DAC.

9. The system according to claim 4, wherein said device for converting said input signal to be measured into a first dc voltage comprises a low pass filter device.

10. A method for accurately measuring the duty cycle of an input periodic pulsed signal comprising the steps of:
    a) converting said input signal to be measured into a first dc voltage;
    b) selecting a duty cycle value from among a plurality of encoded duty cycle values, one encoded duty cycle value of said plurality representing a duty cycle of said input signal;
    c) generating a second dc voltage according to a difference between the duty cycle of said input signal to be measured and the duty cycle represented by said selected encoded duty cycle value at a current iteration;
    d) enabling a comparison of said generated first dc and second dc voltages at said current iteration, and utilizing a result of said comparison for selecting an encoded duty cycle value for a successive iteration; and
    e) repeating steps c) through d) until said first and second dc voltages are matching, wherein said selected encoded duty cycle value at that current iteration represents the duty cycle of said input voltage for output thereof.

11. The method according to claim 10, wherein after said selecting step b), the step of:
    generating a reference dc voltage having a value according to a selected duty cycle value in each iteration.

12. The method according to claim 11, wherein said generating step c) comprises the steps of:
    converting said input signal to be measured into a periodic signal having a duty cycle in accordance with said reference dc voltage value for each iteration; and,
    converting said generated periodic signal into said second dc voltage for each iteration.

13. The method according to claim 12, wherein said selecting step b) comprises the step of:
    generating an output voltage in accordance with a difference between said first dc voltage and second dc voltage at each iteration, and, utilizing said output voltage for selecting a further encoded duty cycle value for a next successive iteration.

14. The method according to claim 12, wherein said step of converting said generated periodic signal into a second dc voltage occurs for a lock time period defined as a time interval for said generated second dc voltage to match said current reference dc voltage in each iteration.

15. The method according to claim 14, further comprising the step of: preventing said comparison of said first dc and second dc voltages during said lock time period, and enabling said comparison at each iteration when said generated second dc voltage matches said current reference dc voltage.

16. The method according to claim 13, wherein said step b) of selecting one duty cycle value of a plurality of encoded duty cycle values further includes inputting said output voltage into an encoding device comprising an n-bit successive approximation register for digitally encoding said duty cycle values, said output voltage enabling selection of a different duty cycle value in each iteration.

17. The method according to claim 16, wherein said output comprises a digitally encoded word capable of being read out one in parallel or shifted out serially to a common output pin.

* * * * *